(12) United States Patent
Fang et al.

(10) Patent No.: US 12,112,111 B1
(45) Date of Patent: Oct. 8, 2024

(54) METHOD FOR ANALYZING STATIC ANALOG INTEGRATED CIRCUIT LAYOUT

(71) Applicants: Bayes Electronics Technology Co., Ltd, Shaoxing (CN); Tessersoft Co., Ltd, Hangzhou (CN)

(72) Inventors: Gang Fang, Shaoxing (CN); Wei Dong, Hangzhou (CN); Jiadong Gu, Shaoxing (CN); Zhenxin Zhao, Hangzhou (CN)

(73) Assignees: Bayes Electronics Technology Co., Ltd, Shaoxing (CN); Tessersoft Co., Ltd, Hangzhou (CN)

( * ) Notice: Subject to any disclaimer, the term of this patent is extended or adjusted under 35 U.S.C. 154(b) by 0 days.

(21) Appl. No.: 18/664,330

(22) Filed: May 15, 2024

(30) Foreign Application Priority Data

May 15, 2023 (CN) .......................... 202310539334.5

(51) Int. Cl.
*G06F 30/367* (2020.01)
(52) U.S. Cl.
CPC .................................. *G06F 30/367* (2020.01)
(58) Field of Classification Search
USPC .......................................................... 716/119
See application file for complete search history.

(56) References Cited

U.S. PATENT DOCUMENTS

| 6,449,578 | B1 | 9/2002 | McBride |
| 6,704,908 | B1 * | 3/2004 | Horan ....................... H03L 7/08 716/112 |

(Continued)

FOREIGN PATENT DOCUMENTS

| CN | 103207941 A | 7/2013 |
| CN | 103793548 A * | 5/2014 ......... G06F 17/5036 |

(Continued)

OTHER PUBLICATIONS

Lu Weimin, et al., ESD damage simulation of integrated circuits by the consideration on parasitic parameters, Journal of Beijing University of Aeronautics and Astronautics, 2011, pp. 1100-1104, vol. 37 No. 9.

(Continued)

*Primary Examiner* — Mohammed Alam
(74) *Attorney, Agent, or Firm* — Bayramoglu Law Offices LLC

(57) ABSTRACT

In a method for analyzing a static analog integrated circuit layout, corresponding simulation netlists are generated from an integrated circuit layout by parasitic parameter extraction, and device-node hypergraph or graph structures reflecting a circuit topological structure are generated from the simulation netlists. Then, characteristics of RC local networks between ports of individual device groups to be matched are analyzed. An independent source current is provided at i-ports of the RC networks, AC analysis is performed on the RC local networks to acquire impedance values of j-ports at different frequencies, and then a circuit mismatch condition is determined by comparing the impedance values of the individual RC local networks. The method automatically analyzes the analog integrated circuit layout to allow automatic analysis and determination of characteristic differences between a layout and a schematic design, improving the reliability of circuit mismatch examination and the efficiency of layout design.

10 Claims, 5 Drawing Sheets

(56) References Cited

U.S. PATENT DOCUMENTS

| | | | |
|---|---|---|---|
| 8,775,993 B2 * | 7/2014 | Huang | G06F 30/392 |
| | | | 716/132 |
| 9,223,915 B1 * | 12/2015 | Ginetti | G06F 30/367 |
| 2006/0200786 A1 | 9/2006 | Chang | |
| 2013/0132920 A1 * | 5/2013 | Soda | G06F 30/36 |
| | | | 716/115 |
| 2013/0326447 A1 | 12/2013 | Huang et al. | |
| 2018/0284170 A1 | 10/2018 | Barrettino et al. | |
| 2019/0211475 A1 * | 7/2019 | Ito | G06F 30/398 |

FOREIGN PATENT DOCUMENTS

| | | | | |
|---|---|---|---|---|
| CN | 109684755 A | | 4/2019 | |
| CN | 111368513 A | | 7/2020 | |
| CN | 113536718 A | | 10/2021 | |
| CN | 113901752 A | | 1/2022 | |
| CN | 112836454 B | | 3/2022 | |
| CN | 115455891 A | | 12/2022 | |
| CN | 116258111 B * | | 8/2023 | |
| DE | 60103608 T2 * | | 6/2005 | G01R 13/00 |

OTHER PUBLICATIONS

Chen Ting, et al., Modeling and simulation on high productivity computer's interconnecting network topology, J. Huazhong Univ. of Sci. & Tech. (Natural Science Edition), 2010, pp. 25-30,36, vol. 38.
Rebecca M. C. Roberts, et al., Layout-Versus-Schematic Verification for Superconductive Integrated Circuits, IEEE Transactions on Applied Superconductivity, 2015, pp. 1-5, vol. 25 No. 3.

* cited by examiner

METHOD FOR ANALYZING STATIC ANALOG INTEGRATED CIRCUIT LAYOUT

CROSS REFERENCE TO THE RELATED APPLICATIONS

This application is based upon and claims priority to Chinese Patent Application No. 202310539334.5, filed on May 15, 2023, the entire contents of which are incorporated herein by reference.

TECHNICAL FIELD

The invention relates to the technical field of circuit mismatch analysis, and in particular to a method for analyzing a static analog integrated circuit layout.

BACKGROUND

In the actual manufacturing process of integrated circuits, a final physical actual value is often different from a nominal design value due to the uncertainty of each processing step, and an absolute deviation value resulting from this manufacturing uncertainty may be as high as 20%. Moreover, since the exact degree of deviation of each component is unpredictable, if the performance of a circuit depends only on the parameter value of a single device, the actual performance of a final circuit may significantly deviate from an expected design target. Different from the absolute deviation, the deviation of a parameter value of the same type of components in a manufacturing process is called a relative deviation, and the degree of mismatch of the relative deviation can be reduced to 1%-0.1% by means of reasonable design and layout design. Therefore, in order to allow the final physical actual circuit performance to approach an ideal design value, the degree of mismatch between the same type of devices is minimized as much as possible.

To this end, in an existing process of analog IC design, a designer often creates a schematic of and a layout of a circuit for layout-versus-schematic (LVS) verification; and the connection correctness of all devices is inspected, and whether the electrical characteristics of each device in the physical layout match the electrical characteristics of a corresponding device in the schematic is determined, ensuring that no mismatch or error exists between the schematic of and the physical layout of the circuit.

The existing means of examination is generally visual inspection, which relies on the ability of the designer to identify a pattern in the layout. However, in the case of a complex circuit, the designer is often unable to quickly and accurately identify components with symmetrical structures, and it is more difficult to accurately determine a circuit mismatch condition. Therefore, this method is often less effective when applied to complex circuits.

Current Mirror: This copies the current flowing in one reference transistor into one or more other transistors. It's often used in setting currents in circuits.

Differential Pair: This evaluates the voltage difference between two paired transistors and is commonly used as an input driver for operational amplifiers.

IPTAT Circuit: This circuit generates a current that's proportional to temperature and is used in temperature-compensated and voltage-independent circuits.

Passive Device Networks: Many circuits rely on the synchronous behavior of passive components like resistors and capacitors, such as voltage dividers.

SUMMARY

In view of the defects in the prior art, the invention provides a method for analyzing a static analog integrated circuit layout, which solves the problem in the prior art that the circuit mismatch condition can hardly be accurately determined in a complex circuit by means of the visual inspection method.

To achieve the object above, the invention provides the following technical solution:

a method for analyzing a static analog integrated circuit layout includes the steps of:

S1, extracting parasitic parameters from a schematic of and a layout of a design circuit to acquire corresponding simulation netlists net_1 and net_2;

S2, identifying the simulation netlists net_1 and net_2 to construct device-node hypergraph or graph structures netgraph_1 and netgraph_2 reflecting a circuit topological structure;

S3, establishing, based on the hypergraph or graph structures, lists devs_list_1 and devs_list_2 to be analyzed and corresponding to the netgraph_1 and netgraph_2, with the lists to be analyzed including device groups and circuit structures; and S4, calculating frequency characteristics of RC networks between ports of all the device groups, matching the device groups in the devs_list_1 and devs_list_2 one by one, and determining whether mismatch exists between the device groups by comparing the frequency characteristics;

wherein in S4, calculating the frequency characteristics of the RC networks comprises the steps of:

S401, providing an independent AC unit source current at i-ports of the RC networks;

S402, performing frequency scanning on each of the RC networks; and

S403, storing node voltage values of j-ports in each frequency point, and performing analysis to acquire a frequency-impedance list.

The principle and advantage of the invention are as follows. In the prior art, a user usually determines whether a circuit is mismatched by means of visual inspection, which, however, is obviously very subjective, with the inspection quality varying from person to person and the inspection results easily affected by the experience of an inspector and the fatigue of the eyes, leading to low inspection efficiency.

In the present solution, the corresponding simulation netlists are first generated from the schematic and layout by a parasitic parameter extraction tool, and then, the device-node hypergraph or graph structures reflecting the circuit topological structure are constructed from the simulation netlists, such that the connection relationship between the devices and the nodes can be clearly displayed. Then, the frequencies of the RC networks between the ports of the individual device groups are controlled to reveal the frequency characteristics of the RC networks. At this point, an independent AC unit source current is provided at i-ports of the RC networks, AC analysis is performed on the RC local networks to acquire voltage values of the j-ports at different frequencies, to thereby analyzing the acquired frequency-impedance list; and then, a circuit mismatch condition can be determined by comparing the impedances of the i-ports of the device groups in the lifts to be analyzed. Therefore, the invention automatically analyzes the analog integrated circuit layout to allow automatic analysis and determination of characteristic differences between a layout and a schematic design, improving the reliability of circuit mismatch examination and the efficiency of layout design.

Preferably, in S4, calculating the frequency characteristics of the RC networks includes the steps of:

S404, calculating impedances of the RC networks between the i-ports and the j-ports at different frequency points according to an equation (1), which is shown as follows:

$$Z_m = \sqrt{R^2 + X^2} \quad (1),$$

in which $Z_m$ indicates a magnitude of impedance, R indicates a real part of impedance, and X indicates an imaginary part of impedance; and whether device groups are mismatched is determined by comparing the impedances between the i-ports and the j-ports at different frequencies in the corresponding RC networks of the layout and the schematic.

Preferably, in S4, calculating the frequency characteristics of the RC networks includes the steps of:

S405, calculating phase differences of the RC networks between the i-ports and the j-ports at the different frequency points according to an equation (2), which is shown as follows:

$$\theta = \arctan\left(\frac{X}{R}\right), \quad (2)$$

in which θ indicates a phase of impedance, R indicates a real part of impedance, and X indicates an imaginary part of impedance; and whether device groups are mismatched is determined by comparing the phases between the i-ports and the j-ports at different frequencies in the corresponding RC networks of the layout and the schematic.

Preferably, in S3, establishing the lists to be analyzed includes the steps of:

S301, determining whether devs_list_1 is preset, if so, detecting a target device group in the netgraph_1, and if not or if the target device group is not detected, automatically searching in the netgraph_1 for a circuit structure to be matched and generating the devs_list_1; and S302, searching for corresponding device groups in the netgraph_2 based on device group name in the devs_list_1, and forming the devs_list_2.

Beneficial effects: The impedances and phase differences of the device groups at the same frequency point are compared to analyze the circuit mismatch condition from a plurality of perspectives, which improves the accuracy in analyzing the circuit mismatch condition.

Preferably, in S301, a rule of searching for the circuit structure includes:

starting with any port of an active device to traverse surrounding structures based on the circuit structure to be matched, starting recursive breadth-first search when a target device structure is encountered, ending the traversal when a new active device or ground is encountered, recording the encountered active device, and generating the devs_list_1.

Beneficial effects: When a device group is identified with the existing visual inspection method, it is often difficult for a designer to quickly find the symmetry of the device group in the case of a complex circuit. Therefore, in the present solution, the recursive breadth-first traversal is performed at the first time after a target device is encountered, and is terminated when a new active device or ground is encountered, so as to find out nearly active devices and identify the device group with symmetry, achieving effective identification of the symmetrical device group in the case of the complex circuit.

Preferably, in the device-node hypergraph or graph structures, each device structure includes a parameter sequence, a type, and a port node, and a number of the port node varies depending on a device type; and for each node structure, a linked list of a device connected to the node structure and a node index are stored.

Preferably, the parameter sequence stores device parameters including a width, a length, and an area.

Preferably, the method further includes: S5, outputtingdevice groups that failed to match.

Preferably, in S402, a frequency scanning range is given or by default 1 Hz-1 GHz.

Preferably, AC scan matching is further used to perform the circuit mismatch analysis, including the steps of:

assuming a given current value of $I_k(s)$, acquiring all transfer function sets (8) of V and $I_k(s)$ according to equations (5), (6), and (7), wherein $$(G+j\omega C)V = I \quad (5),$$

in which G indicates a conductance matrix, C indicates an inductance matrix, j indicates an imaginary unit, ω indicates an angular frequency, V indicates a node voltage vector, and I indicates a node current vector, and the equation (5) is subjected to Laplace transformation to obtain the equation (6):

$$(G+sC)V(s) = I(s) \quad (6),$$

in which s=jω, V(s) indicates the Laplace-transformed node voltage vector, and I(s) indicates the Laplace-transformed node current vector, and then, assuming I(s) as an input and V(s) as an output according to a transfer function definition, a pole-residue equation (7) can be acquired:

$$Z(s) = \sum_{i=1}^{n} \frac{k_i}{s - p_i}, \quad (7)$$

in which Z(s) indicates a pole-residue form, $k_i$ indicates an $i^{th}$ pole-residue value, $p_i$ indicates an $i^{th}$ pole value, and n indicates a number of pole, and assuming a given current value of $I_k(s)$, the all transfer function sets (8) of V and $I_k(s)$ can be acquired according to the above equation:

$$\begin{bmatrix} T(s)_{1,k} \\ T(s)_{2,k} \\ \ldots \\ T(s)_{D,k} \end{bmatrix} \quad (8)$$

according to the equation (8), performing frequency scanning on each transfer function in the transfer function set, if a difference value of the RC network to be matched is within a specified threshold range, considering matching successful, or else, determining circuit mismatch.

DETAILED DESCRIPTION OF THE EMBODIMENTS

The following provides the description in further detail in conjunction with specific embodiments.

Embodiment 1

Figure 1:
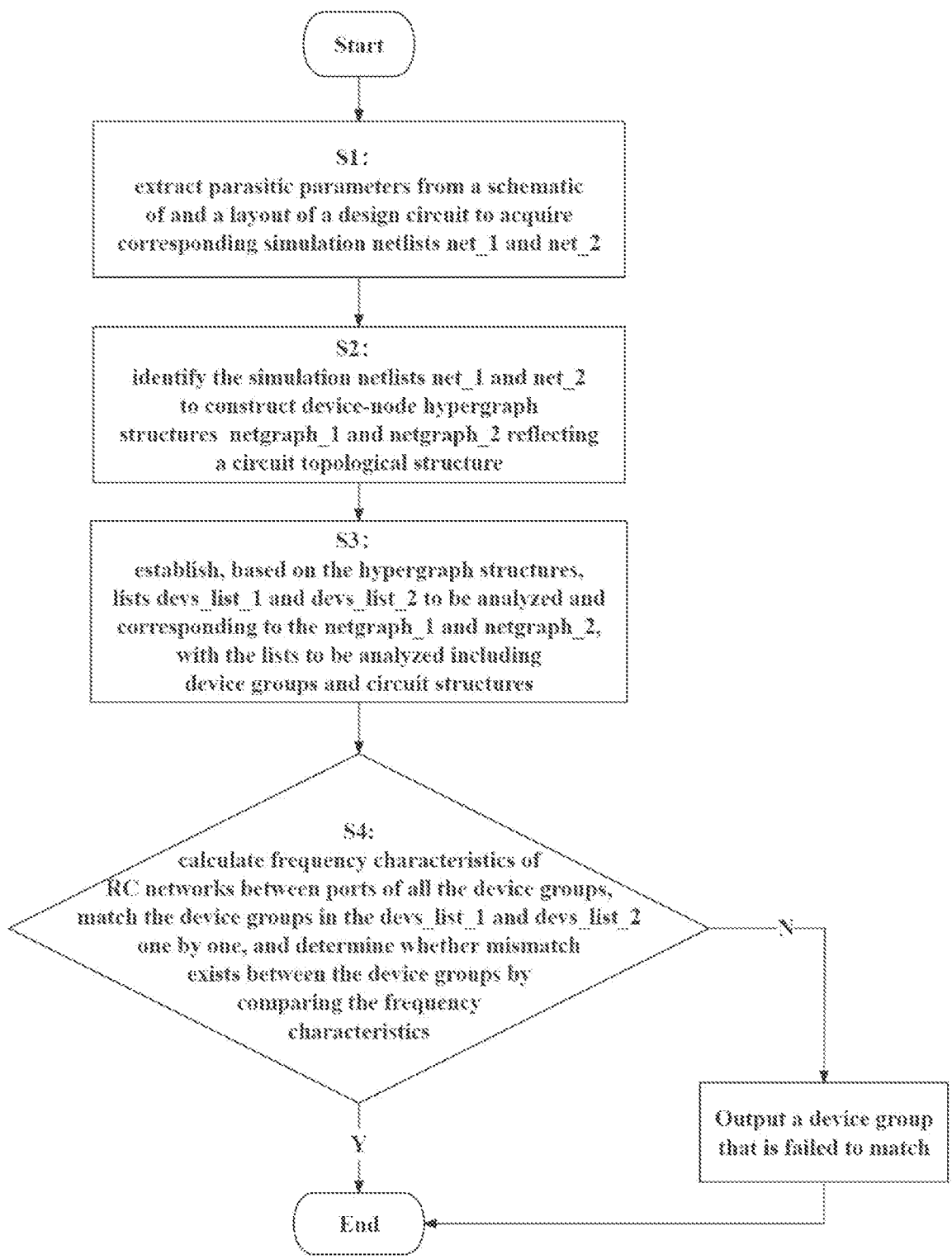
FIG. 1 shows a flowchart of steps of a method for analyzing a static analog integrated circuit layout according to an embodiment of the invention.

Embodiment 1 is basically as shown in FIG. 1, in which a method for analyzing a static analog integrated circuit layout includes: generating netlists from extracted views that are extracted from a schematic and a layout, respectively, by a parasitic parameter extraction tool; then building, based on the netlists, device-node hypergraph or graph structures reflecting circuit topological structures; and finally, performing comparison one by one on corresponding frequency characteristics based on device groups and circuit structures in lists to be analyzed, and determining whether the device groups in the schematic and in the layout are matched, thereby achieving accurate determination on whether a device group in a complex circuit is mismatched.

This solution includes the steps of:

S1, extracting parasitic parameters from a schematic and a layout of a design circuit to acquire corresponding simulation netlists net_1 and net_2;

S2, identifying the simulation netlists net_1 and net_2 to construct device-node hypergraph or graph structures netgraph_1 and netgraph_2 reflecting a circuit topological structure;

S3, establishing, based on the hypergraph or graph structures, lists devs_list_1 and devs_list_2 to be analyzed and corresponding to the netgraph_1 and netgraph_2, with the lists to be analyzed comprising device groups and circuit structures; and S4, calculating frequency characteristics of RC networks between ports of all the device groups, matching the device groups in the devs_list_1 and devs_list_2 one by one, and determining whether mismatch exists between the device groups by comparing the frequency characteristics.

Specifically, in S1, cadence quantus QRC is used as the parasitic parameter extraction tool, and the corresponding SPICE simulation netlists net_1 and net_2 are generated from the schematic and the layout by means of the cadence quantus QRC. For example, an electronic circuit simulation netlist net_1 is defined as follows.

.SUBCKT inv in out vdd gnd
    mp1 out in vdd vdd pbsim4 w=0.4 u l=0.1 u
    mn1 out in gnd gnd nbsim4 w=0.2 u l=0.1 u
.ENDS Here, net_1 calls inv through four ports, including in, out, vdd, and gnd. An RC extraction rule is specify by setting a technology file provided by the fabrication, such that a sub-circuit similar to the following can be acquired from the layout corresponding to the schematic.

.SUBCKT rc_net in out
    r1 in in1 resistor r=2
    r0 in1 out resistor r=2
    c1 in1 out capacitor c=1 u
.ENDS Finally, the netlist of the extracted view is exported, and the RC sub-circuit may be combined with the net_1 through a node to form the net_2. Here, the sub-circuit inv is transformed into the following form.

Figure 2:
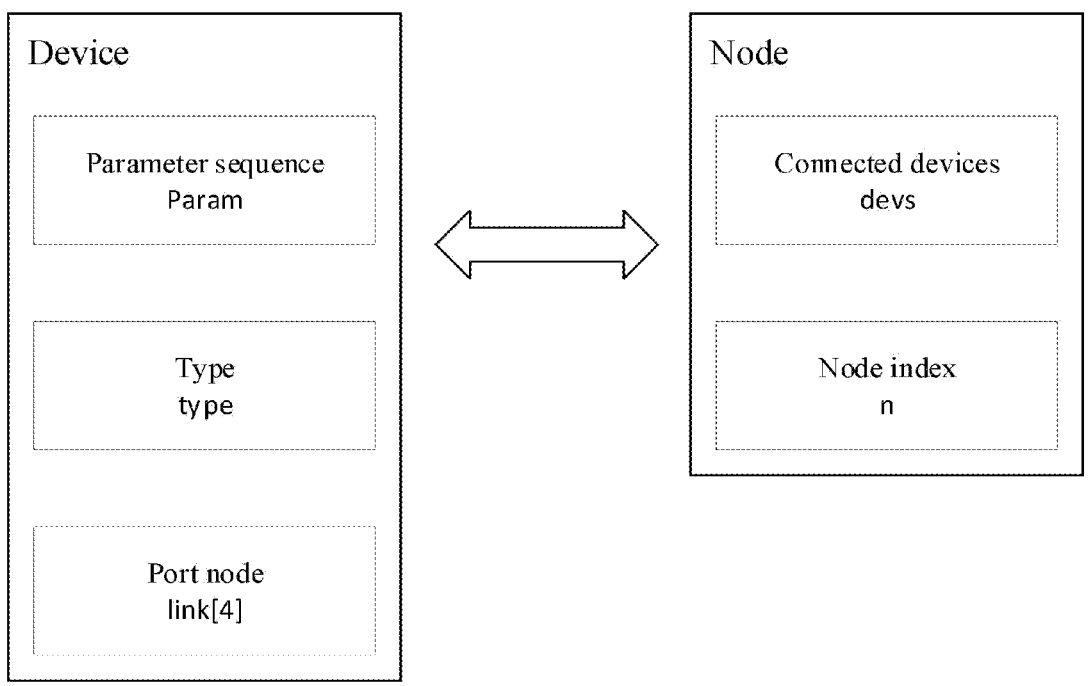
FIG. 2 shows a diagram of a device-node structure in a method for analyzing a static analog integrated circuit layout according to an embodiment of the invention.

.SUBCKT inv_extracted in out vdd gnd
    mp1 out in vdd vdd pbsim4 w=0.4 u l=0.1 u
    mn1 out in gnd gnd nbsim4 w=0.2 u l=0.1 u
    sub_rc out in rc_net
.ENDS As shown in FIG. 2, after the SPICE simulation netlists net_1 and net_2 are acquired, the netlists are parsed to construct, in a memory, the device-node hypergraph or graphstructures reflecting the circuit topological structures.

In the device-node hypergraph or graph structures, each device structure includes a parameter sequence, a type, and a port node. Here, the number of the node varies depending on the device type. For example, a resistor device has only two port nodes, and a bipolar junction transistor (BJT) has three port nodes (in case of two port nodes, the port names are set to i and j, respectively, and in case of three port nodes, an added port name is k, and so forth). In addition, the index of the port node link has a special meaning. When the device is BJT, the indexes 0-2 represent nodes connected a collector, a base, and an emitter. In addition, the parameter sequence stores the reduced parameters of the device, mainly including the width, length, and area of the device. Each node structure stores a device linked list connected to the node structure and a user-defined node index.

Figure 3:
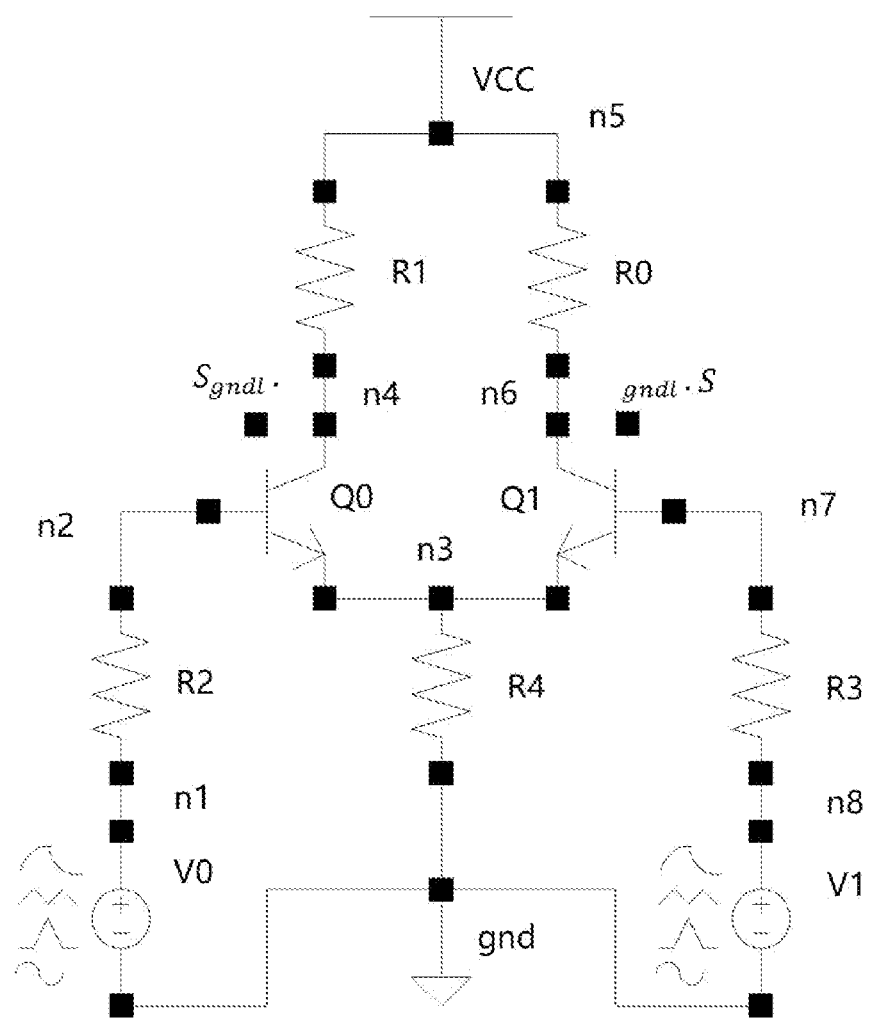
FIG. 3 shows a circuit diagram of a differential amplifier in a method for analyzing a static analog integrated circuit layout according to an embodiment of the invention.
Figure 4:
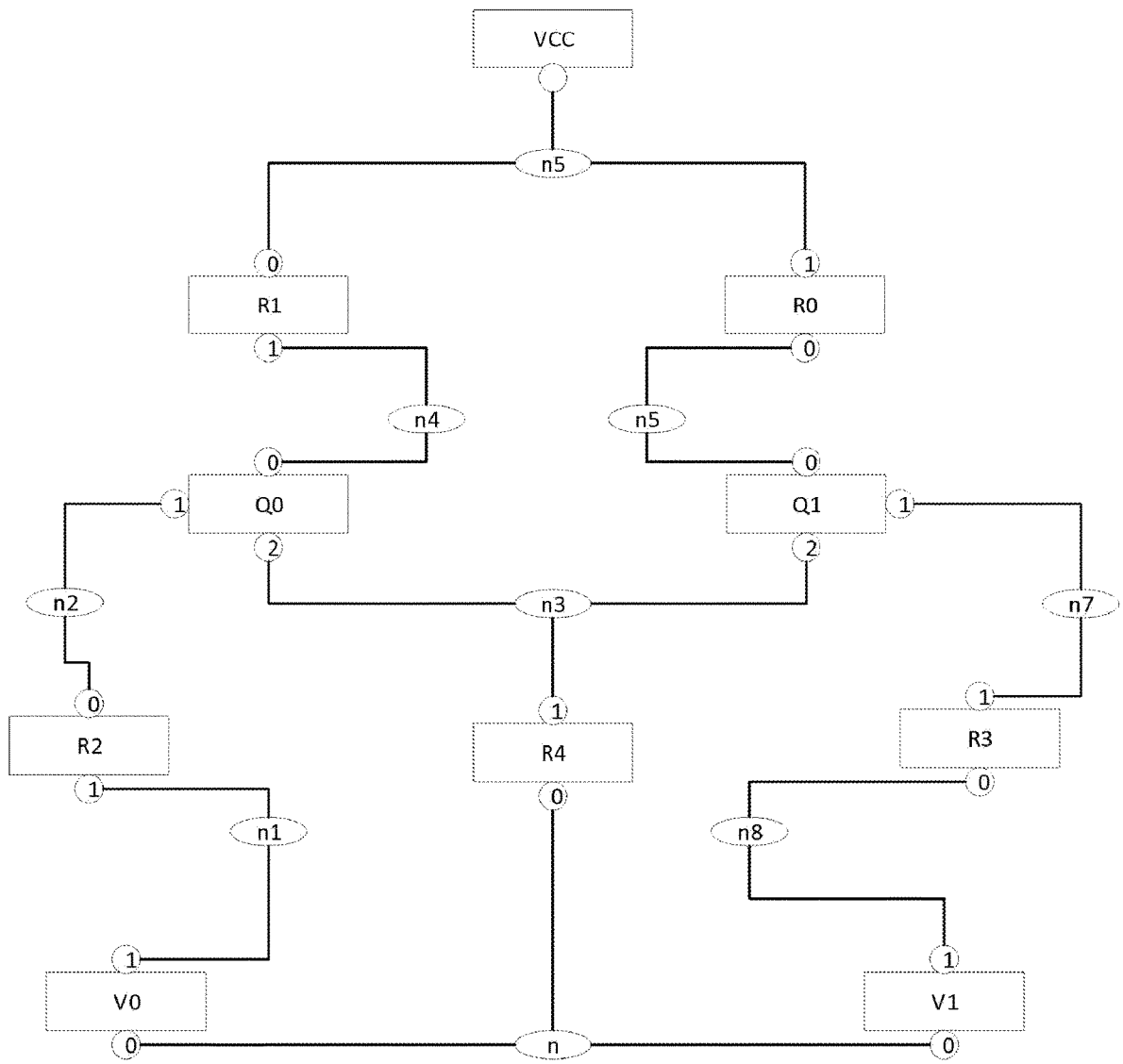
FIG. 4 shows a diagram of differential amplifier hypergraph or graph structures in a method for analyzing a static analog integrated circuit layout according to an embodiment of the invention.

Specifically, in this embodiment where the differential amplification circuit shown in FIG. 3 is taken as an example, differential amplifier hypergraph or graph structures netgraph_1 and netgraph_2 as shown in FIG. 4 are constructed by parsing net_1 and net_2 after the steps mentioned above. In FIG. 4, circles 0, 1, 2 and the like on square device nodes represent the ports. It can be clearly seen that the collector of BJTQ0 is connected to the positive electrode of R1, the emitter of BJTQ0 is connected to the positive electrode of R4 and the emitter of Q1, and the base of the BJTQ0 is connected to the negative electrode of R2.

In this embodiment, in S3, establishing the lists to be analyzed includes the steps of:

S301, determining whether devs_list_1 is preset, if so, detecting a target device group in the netgraph_1, and if not or if the target device group is not detected, automatically searching in the netgraph_1 for a circuit structure to be matched and generating the devs_list_1; and S302, searching for corresponding device groups in the netgraph_2 based on device group name in the devs_list_1, and forming the devs_list_2.

In this embodiment, the list to be analyzed devs_list_1 may be preset by the user through the graphical or technology file interface of a program to set a device group list to be analyzed and a corresponding circuit structure type, and the corresponding format is shown in Table 1.

TABLE 1

Lists to be analyzed

| Device group | Circuit structure |
|---|---|
| (Q0, Q1) | Differential amplification |

When the list to be analyzed devs_list_1 is preset by the user, a target device group is then automatically detected in netgraph_1 according to the list to be analyzed. If the list to be analyzed devs_list_1 is not preset or a corresponding device group is not detected in netgraph_1, a circuit structure needing parasitic parameter matching is then automatically searched to form devs_list_1.

Specifically, this solution includes: starting with any port of an active device to traverse surrounding structures based on the circuit structure to be matched; performing recursive breadth-first search if an RC device is detected; and ending the traversal when a new active device or ground is encountered, during which the encountered active device is recorded; and generating the devs_list_1.

As shown in FIG. 4, when an attempt is made to match a differential amplification sub-structure, the node n3, R4, and the emitter of Q1 are acquired sequentially by starting with the emitter of Q0. That is to say, the emitters of Q0 and Q1 are connected here, and Q0 and Q1 share a common resistor R4. Then, the device parameters param of the Q0 and Q1 are compared. Finally, the RC networks between the emitters of Q0 and Q1 and vcc are analyzed and compared. If a comparison result is within a threshold set by the program, the matching is successful, a differential amplification relationship is then considered present between Q0 and Q1 here, and the device group (Q0,Q1) and a circuit structure type are added to devs_list_1.

After devs_list_1 is acquired, corresponding device groups are searched in the netgraph_2 based on device group name (Q0,Q1) in devs_list_1, and devs_list_2 is formed.

In S4, calculating the frequency characteristics of the RC networks includes the steps of:

S401, providing an independent AC unit source current at i-ports of the RC networks;

S402, performing scanning on each of the RC networks at the frequency of 1 Hz-1 GHz; and S403, storing node voltage values of i-ports in each frequency point, to form a frequency-impedance list.

Specifically, the program performs matching on the device groups in devs_list_1 and devs_list_2 one by one, and compares the frequency characteristics of the RC networks between the ports of the active device in each group, to determine whether mismatch exists.

Figure 5:
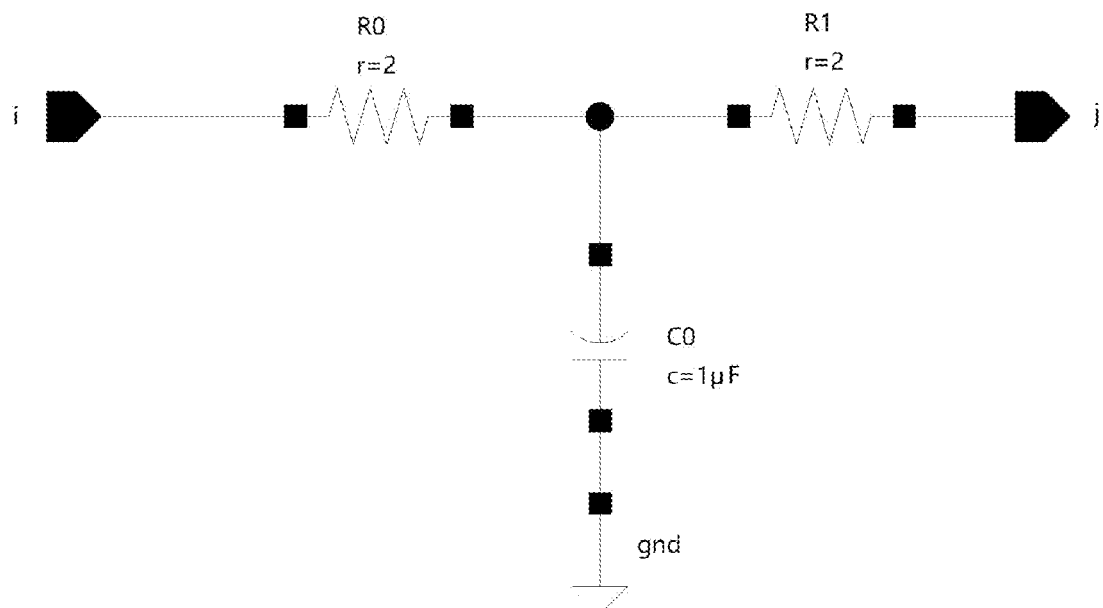
FIG. 5 shows an exemplary diagram of an RC network in a method for analyzing a static analog integrated circuit layout according to an embodiment of the invention.
Figure 6:
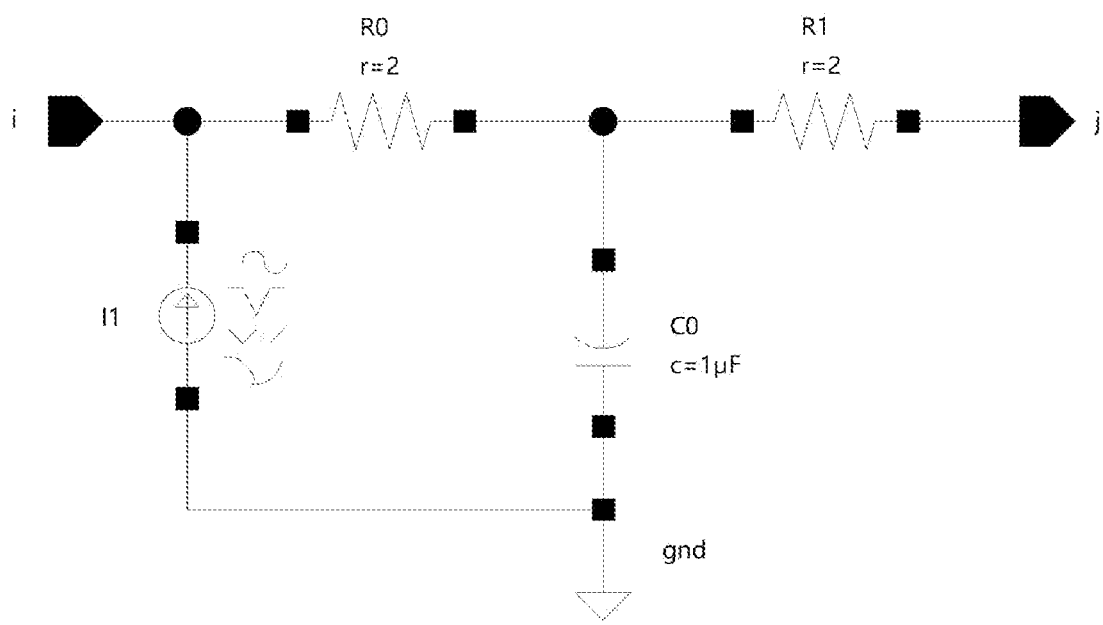
FIG. 6 shows a diagram of RC network transformation in a method for analyzing a static analog integrated circuit layout according to an embodiment of the invention.

In this embodiment, the characteristics at different frequencies are acquired by performing AC analysis on the local networks. As shown in FIG. 5, the resistance values of R1 and R0 are both 2Ω, the capacitance of C0 is 1 e-6 F, and two ports under evaluation are i and j. The program provides an independent source current of 1 A at the i-port and sets the j-port to ground, and a circuit shown in FIG. 6 is then acquired, such that the issue is transformed to AC analysis of the circuit shown in FIG. 6. Here, in this embodiment, each RC network is scanned at the frequency of 1 Hz-1 GHz, the node voltage value of the i-port is stored in each frequency point to form a frequency-voltage value list, and the AC analysis results 1 shown in Table 2 are acquired.

TABLE 2

AC analysis results 1

| Frequency (Hz) | Real part of node i (V) | Imaginary part of node i (V) |
|---|---|---|
| 1 | −4 | 2.51327e−05 |
| 10 | −4 | 0.000251327 |
| 100 | −4 | 0.00251327 |
| 1 k | −3.99968 | 0.0251288 |
| 10 k | −3.96891 | 0.24742 |
| 100 k | −2.77545 | 0.974463 |
| 1 meg | −2.01259 | 0.158153 |
| 10 meg | −2.00013 | 0.0159145 |
| 100 meg | −2 | 0.00159155 |
| 1 g | −2 | 0.000159155 |

After that, the impedances and phase differences of the RC networks between the i-port and the j-port at different frequencies are compared to determine the presence of mismatch. Specifically, as shown in Table 3, the impedance and phase differences of the RC networks between the i-ports and the j-ports at different frequency points may also be calculated according to equations (1) and (2), which are shown as follows:

$$Z_m = \sqrt{R^2 + X^2} \tag{1}$$

$$\theta = \arctan\left(\frac{X}{R}\right) \tag{2}$$

in which $Z_m$ indicates a magnitude of impedance, $\theta$ indicates a phase of impedance, R indicates a real part of impedance, and X indicates an imaginary part of impedance; and whether device groups are mismatched is determined by comparing the impedances and phases between the i-ports and the j-ports at different frequencies in the corresponding RC networks of the layout and the schematic.

TABLE 3

AC analysis results 2

| Frequency (Hz) | i-impedance | i-phase difference |
|---|---|---|
| 1 | 4 | −6.28319e−06 |
| 10 | 4 | −6.28319e−05 |
| 100 | 4 | −0.000628318 |
| 1 k | 3.99976 | 0.0251288 |
| 10 k | 3.97661 | −0.0622591 |
| 100 k | 2.94155 | −0.337655 |
| 1 meg | 2.01879 | −0.0784211 |
| 10 meg | 2.00019 | −0.00795657 |
| 100 meg | 2 | −0.000795774 |
| 1 g | 2 | −7.95775e−05 |

Specifically, the program determines whether a device is mismatched according to an impedance matching equation (3) and a phase matching equation (4).

$$|z_1 - z_2| < z_{abstol} + z_{reltol} * z_{ref} \tag{3}$$

In this equation, $z_{ref} = \max(|z_1|, |z_2|)$, $z_1$ and $z_2$ indicate an impedance pair to be compared, $z_{abstol}$ is set to 0.001Ω during impedance comparison, $z_{reltol}$ is set to 0.001 during impedance comparison, $z_{ref}$ indicates a reference value, and $z_1$ or $z_2$ whichever is greater in absolute value is selected.

$$|\varphi_1 - \varphi_2| < \varphi_{abstol} \tag{4}$$

In this equation, $\varphi_1$ and $\varphi_2$ indicate phases to be compared, and $\varphi_{abstol}$ is set to 5° during phase matching.

In this embodiment, determining mismatch includes the steps of:

S406, determining whether $|z_1|$ or $|z_2|$ is greater than $z_{abstol}$, and if not, going to S407;

S407, determining whether $|z_1-z_2|$ is within a threshold range according to the impedance matching equation, if not, determining that mismatch exists, or else, going to S408; and S408, determining whether $|\varphi_1-\varphi_2|$ is within a threshold range according to the phase matching equation, and if not, determining that mismatch exists.

Specifically, in this embodiment, in a mismatch, the AC scanning results (1 Hz-1 GHz) of the RC networks corresponding to the device ports to be matched in net_1 and net_2 are shown in Table 4, and the impedance and phase at the frequency point of 10 kHz are subjected to threshold matching.

TABLE 4

Impedance-phase data at frequency point of 10 kHz

| Frequency (Hz) | Net1 node Impedance $z_1$ ($\Omega$) | Net1 node phase $\varphi_1$ (°) | Net2 node Impedance $z_2$ ($\Omega$) | Net2 node Phase $\varphi_2$ (°) |
|---|---|---|---|---|
| ... | ... | ... | ... | ... |
| 10k | 3.977099 | −0.89696 | 3.977101 | −0.89723 |
| ... | ... | ... | ... | ... |

Based S406, whether $|z_1|$ or $|z_2|$ is greater than $z_{abstol}$ is determined. It can be seen that:

$|z_1|=3.977099 > z_{abstol}$, and $|z_2|=3.977101 > z_{abstol}$

Thus, the process proceeds to S407. Here, $z_{ref}=\max(|z_1|,|z_2|)=3.977101$, $rhs=z_{abstol}+z_{reltol}*z_{ref}=0.04077101$, $lhs=|z_1-z_2|=2.000000000279556e-06$, and $lhs < rhs$.

Therefore, the process may proceed to S407 to compare the two in terms of phase difference. According to the phase matching equation, it can be seen that:

$lhs=|\varphi_1-\varphi_2|=0.00026999999999999247 < \varphi_{abstol}$.

It thus can be seen that the two match the threshold at this frequency point. By tenfold increase in the frequency range of 1 Hz-1 GHz, the impedance and phase at each frequency point are subjected to threshold matching according to the method described above. If all are matched, the RC network between the two ports is considered to have completed matching, indicating that no circuit mismatch occurs.

Embodiment 2

The basic principle of Embodiment 2 is the same as that of Embodiment 1, with the difference that the circuit mismatch is analyzed by means of AC scan matching.

Specifically, given that the number of nodes is assumed to D for the RC networks, the following equation (5) always holds according to the Kirchhoff's law:

$$(G+j\omega C)V=I \quad (5),$$

in which G indicates a conductance matrix, C indicates an inductance matrix, j indicates an imaginary unit, $\omega$ indicates an angular frequency, V indicates a node voltage vector, and I indicates a node current vector. The equation (5) is subjected to Laplace transformation to obtain the equation (6) below:

$$(G+sC)V(s)=I(s) \quad (6),$$

in which $s=j\omega$, V(s) indicates the Laplace-transformed node voltage vector, and I(s) indicates the Laplace-transformed node current vector. Then, assuming I(s) as an input and V(s) as an output according to a transfer function definition, a pole-residue equation (7) can be acquired as below:

$$Z(s) = \sum_{i=1}^{n} \frac{k_i}{s-p_i}, \quad (7)$$

in which Z(s) indicates a pole-residue form, $k_i$ indicates an $i^{th}$ pole-residue value, $p_i$ indicates an $i^{th}$ pole value, and n indicates a number of pole. Thus, assuming a given current value of $I_k(s)$, all transfer function sets (8) of V and $I_k(s)$ can be acquired according to the above equations:

$$\begin{bmatrix} T(s)_{1,k} \\ T(s)_{2,k} \\ \cdots \\ T(s)_{D,k} \end{bmatrix}. \quad (8)$$

Then, frequency scanning is performed on each transfer function in the transfer function set; if a difference value of the RC network to be matched is within a specified threshold range, matching is considered successful, or else, circuit mismatch is determined; and a program print the information of mismatched device group.

In electronic design, a netlist is a description of the connectivity of an electronic circuit. In its simplest form, a netlist consists of a list of the electronic components in a circuit and a list of the nodes they are connected to. A network (net) is a collection of two or more interconnected components.

Most netlists either contain or refer to descriptions of the parts or devices used. Each time a part is used in a netlist, this is called an "instance".

These descriptions will usually list the connections that are made to that kind of device, and some basic properties of that device. These connection points are called "terminals" or "pins", among several other names.

An instance could be anything from a MOSFET transistor or a bipolar junction transistor, to a resistor, a capacitor, or an integrated circuit chip. And instances have "terminals".

The above only provides the embodiments of the invention, without much description of the common knowledge such as the specific structure and characteristics of the solutions, since those of ordinary skills in the art know all the ordinary technical knowledge in the technical field to which the invention belongs before the filing date or priority date, can obtain all the prior art in the art, and have the ability to apply the conventional experimental means before the date. Those of ordinary skills in the art can improve and implement the present solutions under the hint given by the invention and in combination with their own ability. Some typical common structures or methods should not hinder the implementation of the invention by those of ordinary skills in the art. It should be noted that a number of variations and improvements can be made by a person of ordinary skills in the art without departing from the structure provided by the invention. These variations and improvements shall be construed as falling within the protection scope of the invention, and will not affect the implementation effect and the patent applicability of the invention. The protection scope of the invention shall be subject to the protection scope defined by the Claims. The specific embodiments and others stated in the specifications can be used to interpret the Claims.

What is claimed is:

1. A method for analyzing a static analog integrated circuit layout, comprising steps of:
    S1: extracting parasitic parameters from a schematic of and a layout of a design circuit to acquire corresponding simulation netlists net_1 and net_2;
    S2: identifying the simulation netlists net_1 and net_2 to construct device-node hypergraph or graph structures netgraph_1 and netgraph_2 reflecting a circuit topological structure;
    S3: establishing, based on the device-node hypergraph or graph structures, lists devs_list_1 and devs_list_2 to be analyzed and corresponding to the netgraph_1 and netgraph_2, wherein the lists to be analyzed comprise device groups and circuit structures; and
    S4: calculating frequency characteristics of RC networks between ports of all the device groups, matching the device groups in the devs_list_1 and devs_list_2 one by one, and determining whether mismatch exists between the device groups by comparing the frequency characteristics;
    wherein in S4, calculating the frequency characteristics of the RC networks comprises steps of:
    S401: providing an independent AC unit source current at i-ports of the RC networks;
    S402: performing frequency scanning on each of the RC networks; and
    S403: storing node voltage values of j-ports in each frequency point, and performing analysis to acquire a frequency-impedance list.

2. The method for analyzing the static analog integrated circuit layout according to claim 1, wherein in S4, calculating the frequency characteristics of the RC networks further comprises a step of:
    S404: calculating impedances of the RC networks between the i-ports and the j-ports at different frequency points according to an equation (1), wherein the equation (1) is shown as follows:

$$Z_m = \sqrt{R^2 + X^2} \quad (1),$$

wherein $Z_m$ indicates a magnitude of impedance, R indicates a real part of impedance, and X indicates an imaginary part of impedance; and whether device groups are mismatched is determined by comparing the impedances between the i-ports and the j-ports at different frequencies in the corresponding RC networks of the layout and the schematic.

3. The method for analyzing the static analog integrated circuit layout according to claim 1, wherein in S4, calculating the frequency characteristics of the RC networks further comprises a step of:
    S405: calculating phase differences of the RC networks between the i-ports and the j-ports at different frequency points according to an equation (2), wherein the equation (2) is shown as follows:

$$\theta = \arctan\left(\frac{X}{R}\right), \quad (2)$$

wherein θ indicates a phase of impedance, R indicates a real part of impedance, and X indicates an imaginary part of impedance; and whether device groups are mismatched is determined by comparing the phases between the i-ports and the j-ports at different frequencies in the corresponding RC networks of the layout and the schematic.

4. The method for analyzing the static analog integrated circuit layout according to claim 1, wherein in S3, establishing the lists to be analyzed comprises steps of:
    S301: determining whether devs_list_1 is preset, when devs_list_1 is preset, detecting a target device group in the netgraph_1, and when devs_list_1 is not preset or when the target device group is not detected, automatically searching in the netgraph_1 for a circuit structure to be matched and generating the devs_list_1; and
    S302: searching for corresponding device groups in the netgraph_2 based on device group name in the devs_list_1, and forming the devs_list_2.

5. The method for analyzing the static analog integrated circuit layout according to claim 4, wherein in S301, a rule of searching for the circuit structure comprises:
    starting with any port of an active device to traverse surrounding structures based on the circuit structure to be matched, starting recursive breadth-first search when a target device structure is encountered, ending the traversal when a new active device or ground is encountered, recording the encountered active device, and generating the devs_list_1.

6. The method for analyzing the static analog integrated circuit layout according to claim 4, wherein in the device-node hypergraph or graph structures, each device structure comprises a parameter sequence, a type, and a port node, wherein a number of the port node varies depending on a device type; and for each node structure, a linked list of a device connected to the node structure and a node index are stored.

7. The method for analyzing the static analog integrated circuit layout according to claim 6, wherein the parameter sequence stores device parameters comprising a width, a length, and an area.

8. The method for analyzing the static analog integrated circuit layout according to claim 1, further comprising S5: outputting device groups that failed to match.

9. The method for analyzing the static analog integrated circuit layout according to claim 1, wherein in S402, a frequency scanning range is given or by default 1 Hz-1 GHz.

10. The method for analyzing the static analog integrated circuit layout according to claim 1, wherein AC scan matching is further used to perform a circuit mismatch analysis, comprising steps of:
    assuming a given current value of $I_k(s)$, acquiring all transfer function sets (8) of V and $I_k(s)$ according to equations (5), (6), and (7), wherein $$(G + j\omega C)V = I \quad (5),$$

wherein G indicates a conductance matrix, C indicates an inductance matrix, j indicates an imaginary unit, ω indicates an angular frequency, V indicates a node voltage vector, and I indicates a node current vector, and the equation (5) is subjected to Laplace transformation to obtain the equation (6):

$$(G + sC)V(s) = I(s) \quad (6),$$

wherein s=jω, V(s) indicates a Laplace-transformed node voltage vector, and I(s) indicates a Laplace-transformed node current vector; and then, assuming I(s) as an input and V(s) as an output according to a transfer function definition, a pole-residue equation (7) is acquired:

$$Z(s) = \sum_{i=1}^{n} \frac{k_i}{s - p_i}, \tag{7}$$

wherein Z(s) indicates a pole-residue form, $k_i$ indicates an $i^{th}$ pole-residue value, $p_i$ indicates an $i^{th}$ pole value, and n indicates a number of pole; and assuming a given current value of $I_k(s)$, the all transfer function sets (8) of V and $I_k(s)$ are acquired according to the above equation:

$$\begin{bmatrix} T(s)_{1,k} \\ T(s)_{2,k} \\ \ldots \\ T(s)_{D,k} \end{bmatrix} v; \text{ and} \tag{8}$$

according to the equation (8), performing frequency scanning on each transfer function in the transfer function set; when a difference value of the RC network to be matched is within a specified threshold range, considering matching successful; when the difference value of the RC network to be matched is out of the specified threshold range, determining circuit mismatch.

* * * * *